(12) United States Patent
Kobayashi et al.

(10) Patent No.: US 7,666,694 B2
(45) Date of Patent: Feb. 23, 2010

(54) METHOD FOR MANUFACTURING SEMICONDUCTOR LASER DEVICE AND SEMICONDUCTOR LASER DEVICE

(75) Inventors: Masahide Kobayashi, Kanagawa (JP); Shotaro Kitamura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 158 days.

(21) Appl. No.: 11/522,356

(22) Filed: Sep. 18, 2006

(65) Prior Publication Data
US 2007/0064759 A1    Mar. 22, 2007

(30) Foreign Application Priority Data
Sep. 22, 2005    (JP)    ............... 2005-276440

(51) Int. Cl.
*H01L 27/15*    (2006.01)
*H01S 5/22*    (2006.01)
(52) U.S. Cl. .......................... 438/32; 438/39
(58) Field of Classification Search .................. 438/39, 438/FOR. 289; 257/E33.43
See application file for complete search history.

(56) References Cited

U.S. PATENT DOCUMENTS

| | | | | |
|---|---|---|---|---|
| 5,292,685 A | * | 3/1994 | Inoguchi et al. | 438/32 |
| 6,323,507 B1 | * | 11/2001 | Yokoyama et al. | 257/79 |
| 2002/0031152 A1 | * | 3/2002 | Funabashi et al. | 372/43 |
| 2002/0186736 A1 | * | 12/2002 | Takahashi | 372/50 |
| 2004/0119079 A1 | * | 6/2004 | Hayakawa et al. | 257/80 |
| 2005/0254541 A1 | * | 11/2005 | Okuda | 372/96 |
| 2006/0165147 A1 | * | 7/2006 | Kim | 372/96 |
| 2007/0053404 A1 | * | 3/2007 | Makino | 372/96 |

FOREIGN PATENT DOCUMENTS

| | | |
|---|---|---|
| JP | 07-170018 A | 7/1995 |
| JP | 2000-138413 A | 5/2000 |

* cited by examiner

*Primary Examiner*—George Fourson
(74) *Attorney, Agent, or Firm*—Sughrue Mion, PLLC

(57) ABSTRACT

An improved throughput can be presented, since an influence of the deterioration in crystallinity created in the epitaxial layer can be eliminated by a simple and easy method, and a semiconductor laser device having stabilized properties such as threshold current, slope efficiency, device life time and the like can be presented. A method for manufacturing a semiconductor laser device according to the present invention comprises: forming partially a diffraction grating on a surface of a semiconductor substrate or on a film on the surface of the semiconductor substrate; and forming a multiple-layered film by forming an epitaxial layer on a surface of the diffraction grating. The operation of forming the diffraction grating includes an operation of forming the diffraction grating so that a width of the diffraction grating in a direction that is orthogonal to a cavity direction of the semiconductor laser device is presented as a width equal to or longer than a sum of a mesa width and 30 μm.

3 Claims, 11 Drawing Sheets

METHOD FOR MANUFACTURING SEMICONDUCTOR LASER DEVICE AND SEMICONDUCTOR LASER DEVICE

This application is based on Japanese patent application No. 2005-276,440, the content of which is incorporated hereinto by reference.

BACKGROUND

1. Technical Field

The present invention relates to a semiconductor laser including a diffraction grating formed in the device, and to a method for manufacturing the semiconductor laser device.

2. Related Art

In fiber optic communications, a distributed feedback semiconductor laser device or a distributed Bragg reflection semiconductor laser device, which are oscillable in a single longitudinal mode, are employed mainly as light source for a middle long distance range. These semiconductor laser devices have a region including a diffraction grating formed therein, and such region of the diffraction grating provides an emission of a laser beam having a specific wave length.

Typical process for forming a diffraction grating may include an interferometric exposure process. In the interferometric exposure process, first of all, a resist is applied on a semiconductor substrate, and an exposure process is conducted with an interferometric pattern of a laser beam that is composed of divided two optical paths. In this case, a pitch of the diffraction grating can be adjusted by suitably adjusting an angle of incidence of laser beam. Subsequently, a developing process is conducted to form a resist film having a diffraction grating pattern. Further, the diffraction grating pattern is transferred onto the semiconductor substrate via a wet etch process or a dry etch process through a mask of such resist film to form the diffraction grating.

A diffraction grating formed by an interferometric exposure process described in Japanese Patent Laid-Open No. H7-170,018 (1995, p. 12, FIG. 14 and FIG. 15) is shown in FIG. 11. As shown in FIG. 11, a diffraction grating 104 is formed over the entire surface of a substrate 102.

Since the interferometric exposure process described in Japanese Patent Laid-Open No. H7-170,018 instantly achieves exposing the resist to light over a wider region on the semiconductor substrate, the formation of the diffraction grating by such process is an effective technique, in view of providing an improved throughput. Nonetheless, precise controls in a pitch of the diffraction grating and a phase shift level are difficult, and thus it is difficult to achieve higher wavelength controllability and singularity in wave mode, which are requested in the industrial area of fiber optic communications in recent years, with higher yield.

On the other hand, another process for forming the diffraction grating may be a high-resolution electron beam exposure process. In the electron beam exposure process, an improved wavelength controllability and singularity in wave mode, which are not achieved in the interferometric exposure process, can be achieved. However, in the electron beam exposure process, a dislocation may be often generated in an epitaxial layer formed on the semiconductor substrate to deteriorate a crystallinity thereof, or a crystal formulation and a thickness of a crystallized layer may be often abnormalized to deteriorate a crystallinity thereof. The region, where such crystallinity is deteriorated, is created by an influence of a bump formed in a boundary between a region having a diffraction grating on the semiconductor substrate and a region having no diffraction grating (hereinafter referred to as a diffraction grating boundary) in an etch process.

When such crystallinity-deteriorated region is included in the laser device, deteriorations in properties such as an increase of threshold current, a decrease in slope efficiency, a decreases in device life time and the like are created. In particular, when an active layer is formed on the diffraction grating, a controllability in wavelength is often reduced.

In addition, while a typical method for avoiding the deterioration of crystallinity due to the bump of the semiconductor created in the diffraction grating boundary in the etch process includes a method for forming the diffraction grating over the entire surface of the semiconductor via an electron beam exposure process, similarly as the interferometric exposure process, such method requires longer time for the exposure process, and thus a throughput efficiency is considerably reduced.

Further, a typical method for preventing a deterioration in crystallinity caused in the electron beam exposure process is a method described in Japanese Patent Laid-Open No. 2000-138,413. In Japanese Patent Laid-Open No. 2000-138,413, a method is described, in which a diffraction grating pattern is formed via an electron beam exposure and further a deep UV exposure is conducted for a region where no diffraction grating is to be formed. It is described according to such method that a bump formed between the region for forming the diffraction grating and the region for forming no diffraction grating is reduced.

However, there is a room for improvement in view of the following points in the conventional technology described in Japanese Patent Laid-Open No. 2000-138,413. First, the method additionally requires conducting the deep UV exposure process for the region for forming no diffraction grating, after the diffraction grating pattern is formed, and therefore the process may be complicated and time required for the exposure process may be increased, leading to a reduced throughput.

Second, it is often difficult to precisely conduct the deep UV exposure process only over the region for forming no diffraction grating with better controllability, such that a bump would be created between the region for forming the diffraction grating and the region for forming no diffraction grating, and thus deteriorations in properties such as an increase of threshold current, a decrease in slope efficiency, a decreases in device life time and the like are possibly created.

SUMMARY OF THE INVENTION

According to one aspect of the present invention, there is provided a method for manufacturing a semiconductor laser device, comprising: forming partially a diffraction grating on a surface of a semiconductor substrate or on a film on the surface of the semiconductor substrate; and forming a multiple-layered film by forming an epitaxial layer on a surface of the diffraction grating, wherein the forming the diffraction grating includes forming the diffraction grating so that a width of the diffraction grating in a direction that is orthogonal to a cavity direction of the semiconductor laser device is presented as a width equal to or longer than a sum of a mesa width and 30 µm.

Since an influence of the deterioration in crystallinity created in the epitaxial layer can be eliminated by a simple and easy method according to such method for manufacturing of the semiconductor laser device, an improved throughput can be presented, and a semiconductor laser device having stabilized properties such as threshold current, slope efficiency, device life time and the like can be presented.

According to another aspect of the present invention, there is provided a semiconductor laser device, comprising: a semiconductor substrate; a multiple-layered film including an active layer formed on the semiconductor substrate via an epitaxial growth process; and a diffraction grating formed in the semiconductor substrate surface or multiple-layered film, wherein the diffraction grating is formed partially in a direction orthogonal to a cavity direction of the semiconductor laser device, and a width of the diffraction grating is equal to or larger than a sum of a mesa width and 30 µm.

Since an influence of the deterioration in crystallinity created in the epitaxial layer can be eliminated according to such semiconductor laser device, an improved throughput can be presented, and properties such as threshold current, slope efficiency, device life time and the like can be stabilized.

Since an influence of the deterioration in crystallinity created in the epitaxial layer can be eliminated by a simple and easy method according to the present invention, an improved throughput can be presented, and a semiconductor laser device having stabilized properties such as threshold current, slope efficiency, device life time and the like can be presented.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be repeated.

First Embodiment

Figure 1:
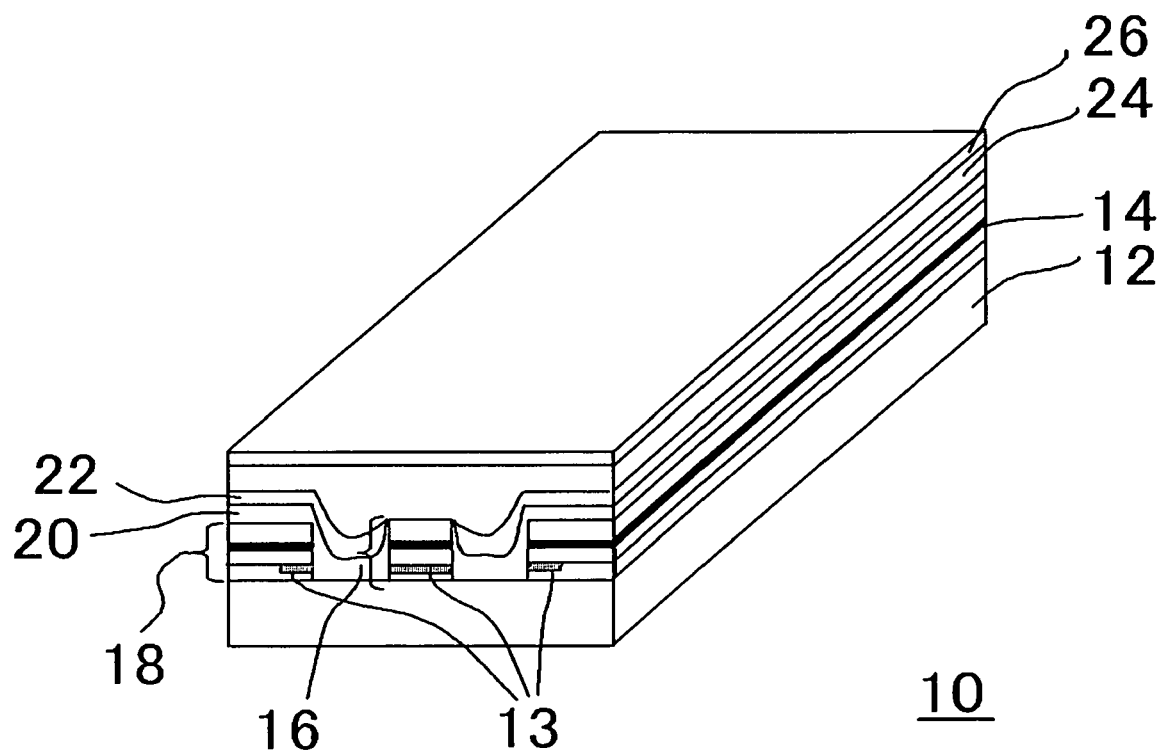
FIG. 1 is a perspective view, schematically illustrating a semiconductor laser device obtained by a manufacturing process according to first embodiment.

FIG. 1 is a perspective view of a distributed feedback semiconductor laser device in first embodiment.

As shown in FIG. 1, a semiconductor laser device 10 includes, on a semiconductor substrate (n-type indium phosphide (InP substrate 12), an active layer mesa 16 having a mesa geometry and serving as an optical guide layer including an active layer 14 and a pair of recombined layers 18 for providing an improved carrier block breakdown voltage. The active layer mesa 16 is formed to be n-type in lower mesa and to be p-type in upper mesa.

The active layer mesa 16 includes an n-type indium gallium arsenide phosphide (InGaAsP) guide layer, a first separate confinement heterostructure (SCH) layer composed of undoped InGaAsP, an undoped multiple quantum well (MQW) active layer 14 composed of five layers, a second SCH layer composed of undoped InGaAsP and a p-type InP clad layer, all of which are stacked in this sequence on a surface of an n-type InP buffer layer formed on the n-type InP substrate 12. In addition to above, the recombined layer 18 also has a similar multiple-layered structure.

The semiconductor laser device 10 of first embodiment further includes a p-type InP current block layer 20 and an n-type InP current block layer 22, which are formed in this sequence from a side of the active layer mesa 16 over a portion above the recombined layer 18. A p-type InP clad layer 24 and a p-type InGaAs cap layer 26 are deposited in sequence, so as to cover the active layer mesa 16 and the n-type InP current block layer 22.

In the present embodiment, a diffraction grating 13 is provided under the active layer 14, in an interior of the active layer mesa 16 and in the interior of pair of recombined layers 18. A width of the diffraction grating 13 is equal to or longer than a sum of a mesa width (width of active layer mesa 16)+30 µm. Here, the width of the diffraction grating 13 in the present embodiment means a width from an end of the diffraction grating 13 existing in one recombined layer 18 to an end of the diffraction grating 13 existing in other recombined layer 18. Having the width of the diffraction grating 13 within such range, the interior of the crystal composing the active layer mesa 16 has no crystal defect or no crystallinity-deteriorated region that contains an abnormality in the crystal formulation and the crystal layer thickness. Therefore, according to the semiconductor laser device of the present embodiment, stabilized properties such as threshold current, slope efficiency and device life time and the like can be provided. Further, by selecting the width of the diffraction grating 13 to be equal to or longer than 40 µm, substantially no crystallinity-deteriorated region appears in the active layer mesa 16. Therefore, the configuration provides considerable improvements in the above-described advantageous effect.

On the other hand, the recombined layer 18 contains a crystallinity-deteriorated region. Nevertheless, it is sufficient that this region may serve as a site for escaping a carrier, which has been accumulated in the p-type InP current block layer 20 and the n-type InP current block layer 22, and thus this region does not fundamentally affect the device operation.

In addition, in the semiconductor laser device in the present embodiment, the above-described n-type may be changed to p-type and the above-described p-type may be changed to n-type.

Such semiconductor laser device 10 may have a dimension, in which a device width in a direction perpendicular to the cavity direction is about 250 μm and a device length in the cavity direction is about 600 μm.

In addition to above, in the diagrams of the semiconductor laser device of first embodiment illustrated in FIG. 1, electrodes formed on a lower surface of the substrate and on the top surface of the p-type InGaAs cap layer 26 or an antireflective coating an highly reflective coating formed on an end surface in the cavity direction are not shown.

Figure 2A:
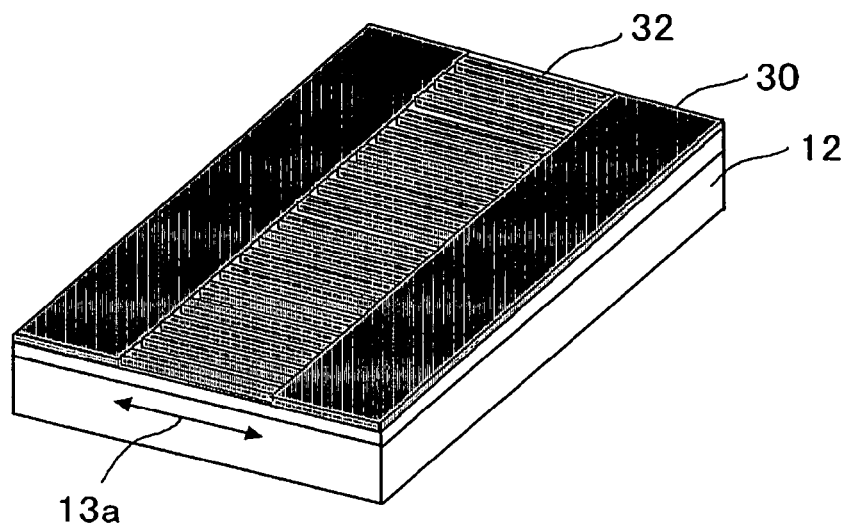
FIGS. 2A and 2B are perspective views of the semiconductor laser device, schematically illustrating operations in a manufacturing process according to first embodiment.

Next, a method for manufacturing the semiconductor laser device in first embodiment will be described in reference to FIG. 2A to FIG. 7. First of all, as shown in FIG. 2A, a positive type resist for the use in the electron beam exposure is applied on an n-type InP buffer layer formed on the n-type InP substrate 12, and a diffraction grating pattern 32 is formed partially in the resist film 30 via an electron beam exposure process, so that a drawing width 13a is equal to or longer than the mesa width+30 μm. While an upper limit of the drawing width 13a is not particularly limited, the drawing width may be selected to be 100 μm, in view of providing an enough time required for the exposure process and/or providing an improved throughput efficiency. In the present embodiment, descriptions will be made in reference to an exemplary implementation that includes a diffraction grating pattern 32 having a drawing with 13a of 40 μm.

Subsequently, a diffraction grating pattern 32 formed in the resist film 30 is transferred to an n-type InP buffer layer via a wet etch or a dry etch process. Further, the resist film is removed to form the diffraction grating 13 on the surface of the n-type InP buffer layer (FIG. 2B).

Here, the diffraction grating 13 is formed to have a pitch of about 0.243 μm for providing a selectivity of an emission wavelength, and in addition, a λ/4 phase shift 34 for providing a phase change, which corresponds to a quarter of a length of a standing wave of laser beam created in a cavity or in other words, corresponds to a half period of the pitch of the diffraction grating, is created in the diffraction grating 13, thereby providing a single mode selectivity. In addition to above, the λ/4 phase shift 34 is formed at a position of about 360 μm therefrom within the laser device having a cavity length 36 of 600 μm, provided that a side of emitting larger optical output of a signal light is taken as a front side of the laser device (i.e., origin in the laser device).

Figure 2B:
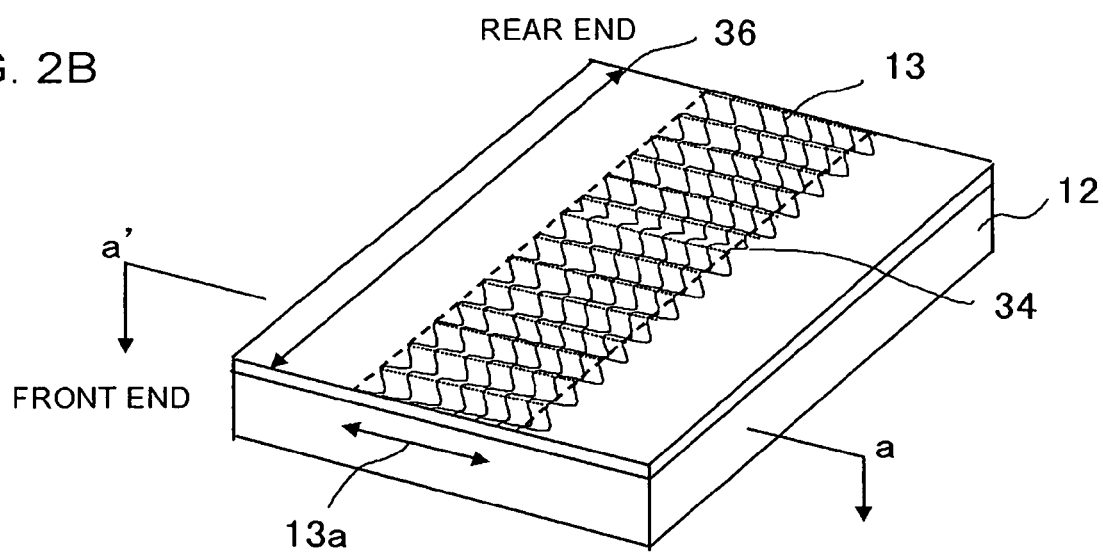
Figure 4:
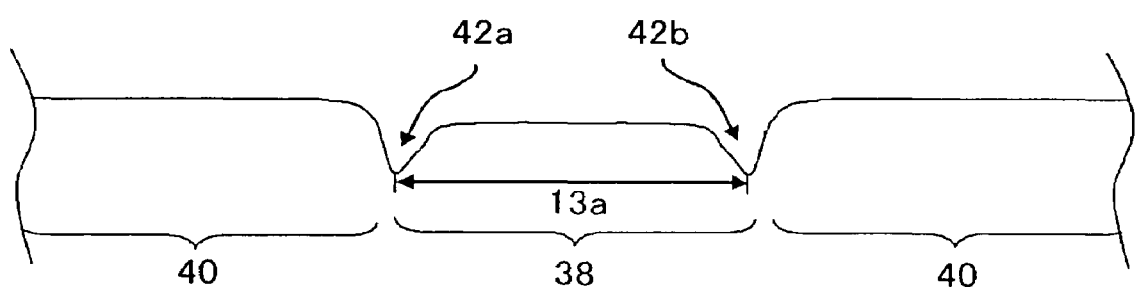
FIG. 4 is a cross-sectional view of the device shown in FIG. 2B along line a-a'.

FIG. 4 is a local sectional view of the n-type InP substrate 12 shown in FIG. 2B along line a-a' which is perpendicular to the cavity direction. As shown in FIG. 4, a bump is formed in diffraction grating boundaries 42a and 42b, which is formed between a region 38 having the diffraction grating 13 formed therein and a region 40 having no diffraction grating.

Such bump is formed along the following mechanism. When a positive resist, for example, is employed in the exposure process, a resist film 30 is remained on the entire surface of the region having no diffraction grating 13 on the n-type InP buffer layer after the developing process. Therefore, when a diffusion-controlling etchant is employed in the etch process, no etchant is consumed by the resist film in this region, and therefore a larger bump is formed in the diffraction grating boundary. On the other hand, in any case of employing a negative resist in the exposure process, conducting a dry etching process for the etch process and conducting an etch process after partially removing the resist except the portion of the resist on the region for forming the diffraction grating, a bump is unavoidably to be formed by in the diffraction grating boundary.

Figure 3C:
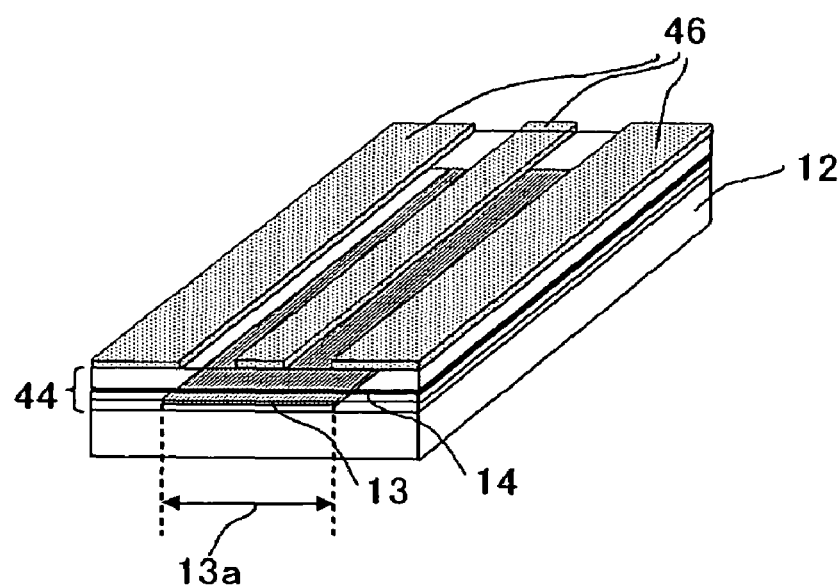
FIGS. 3C, 3D and 3E are perspective views of the semiconductor laser device, schematically illustrating operations in a manufacturing process according to first embodiment.

Next, a predetermined epitaxial layer is formed on the n-type InP buffer layer having the diffraction grating 13 formed thereon via an epitaxial growing process to form a semiconductor multiple-layered film 44 including an active layer 14. Further, an oxide film 46 such as $SiO_2$ and the like having a predetermined pattern formed via an etch process is formed on the surface of the semiconductor multiple-layered film 44 (FIG. 3C). The oxide film 46 may be formed via, for example, a thermal chemical vapor deposition (CVD) process, a photolithography process or an etch process with hydrofluoric acid.

The semiconductor multiple-layered film 44 functions as an optical guide layer. The semiconductor multiple-layered film 44, more specifically, is configured by sequentially depositing the following layers on the n-type InP buffer layer.

(1) n-type InGaAsP guide layer (wavelength composition of 1.1 μm, thickness of about 0.1 μm, and doping concentration of $1\times10^{18}$ $cm^{-3}$);

(2) a first SCH layer composed of an undoped InGaAsP (wavelength composition of 1.1 μm, and thickness of about 50 nm);

(3) 5 layers of undoped MQW active layers (well layer: wavelength composition of 1.5 μm and thickness of about 5 nm; barrier layer: wavelength composition of 1.2 μm and thickness of about 10 nm);

(4) a second SCH layer composed of an undoped InGaAsP (wavelength composition of 1.1 μm and thickness of about 50 nm); and (5) p-type InP clad layer (thickness of about 0.1 μm and doping concentration of $1\times10^{18}$ $cm^{-3}$).

Subsequently, dry etch process is conducted through a mask of the oxide film 46. Alternatively, a wet etch process may be conducted through a mask of a resist film, in place of the oxide film 46.

Figure 3D:
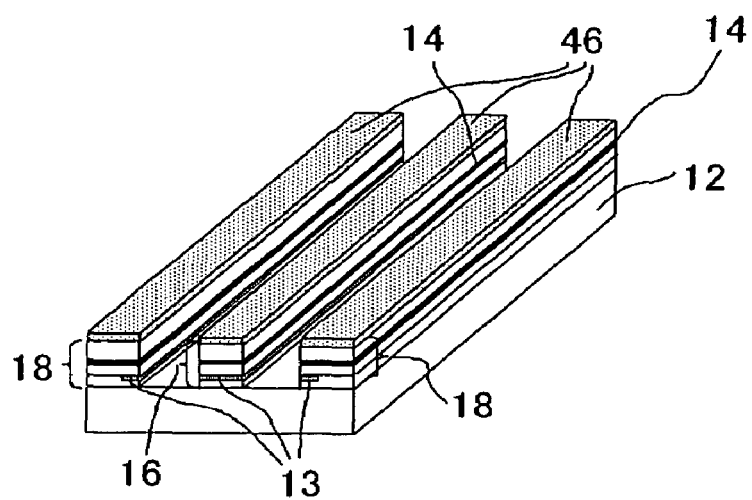
Figure 3E:
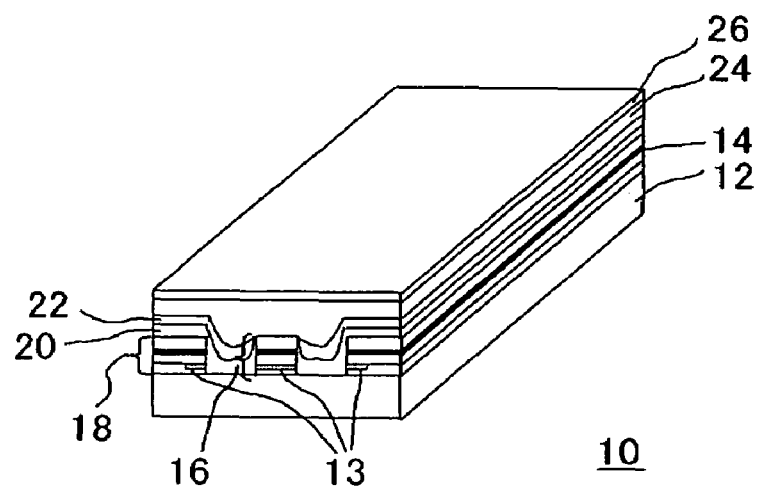

Such dry etch process through a mask of the oxide film 46 provides the active layer mesa 16 having a width of 2.0 μm and a depth of about 2.0 μm formed in the semiconductor multiple-layered film 44, and further, a pair of recombined layers 18 are formed so that the formed recombined layers are remote from the active layer mesa 16 by about 5 μm (FIG. 3D). In addition to above, the diffraction grating 13 may be formed on (001) surface of the n-type InP substrate 12, and the surface of the n-type InP substrate 12 may be removed in such dry etch process to form the active layer mesa 16 and pair of the recombined layers 18. Alternatively, a configuration of forming no recombined layer 18 may also be employed.

Next, only portions of the oxide film 46 disposed above the pair of the recombined layers 18 are removed to leave the portions of the oxide film 46 above the active layer mesa 16. A selective metalorganic vapor phase epitaxy (MOVPE) growth is conducted by utilizing such portions of the oxide film 46 as mask to consecutively form the p-type InP current block layer 20 having a thickness of about 0.8 μm and the n-type InP current block layer 22 having a thickness of about 0.8 μm.

Subsequently, a portion of the oxide film 46 disposed above the active layer mesa 16 is completely removed, and then, the p-type InP clad layer 24 having a thickness of about 3 μm and the p-type InGaAs cap layer 26 having a thickness of about 0.3 μm are formed so as to cover the upper portion of the active layer mesa 16 and the n-type InP current block layer 22.

Then, a p-electrode and an n-electrode composed of TiAu are formed on both sides thereof, and thereafter, an electrode-alloying process is conducted at a temperature of 430 degree C. to complete the manufacture of the device. Subsequently, a device is cut out to have a device length of 600 μm and a device width of 250 μm, and then, an antireflective coating (AR) coating exhibiting a reflectivity of equal to or lower than 0.1% is provided on the front end surface (light emitting surface), and a highly reflective (HR) coating exhibiting a reflectivity of 75% is provided on the rear end surface thereof. By such manufacturing process, the semiconductor laser device is obtained.

Advantageous effects obtainable by employing the configuration of the present embodiment will be described as follows. According to the method for manufacturing the semiconductor laser device of the present embodiment, an influence of the deterioration in crystallinity can be eliminated, by simply providing the width of the diffraction grating in the direction perpendicular to the cavity direction of the semiconductor laser device as a length equal to or longer than a sum of mesa width+30 μm, when the diffraction grating is formed. Therefore, an improved throughput can be presented, and further, a semiconductor laser device having stabilized properties such as threshold current, slope efficiency, device life time and the like can be obtained by a simple process.

Such advantageous effects can be obtained, since no crystallinity-deteriorated region exists in the region where active layer mesa 16 is formed in the semiconductor multiple-layered film 44. This will be further described as follows.

Figure 5:
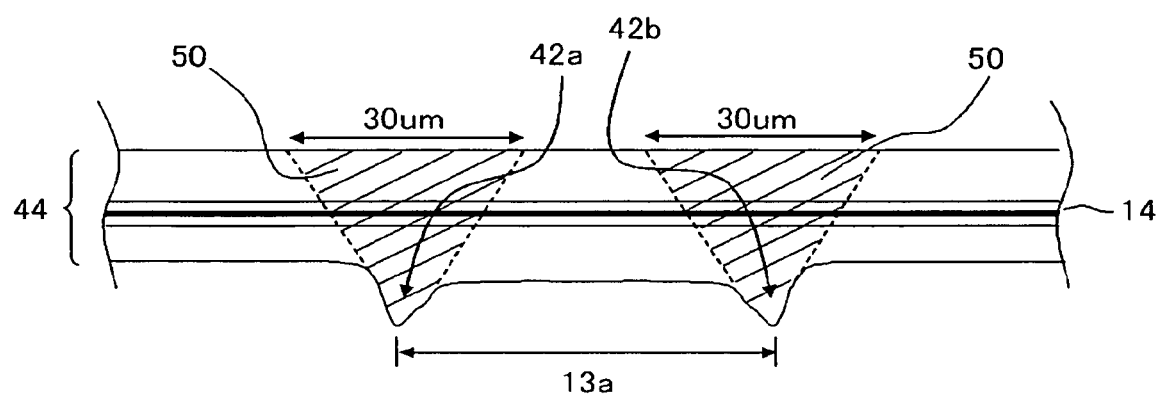
FIG. 5 is a cross-sectional view of the device according to first embodiment, schematically illustrating a formation of a crystallinity-deteriorated region within a semiconductor multiple-layered film in the manufacturing process according to first embodiment.

A local-sectional view of the semiconductor multiple-layered film 44 having an epitaxial layer that is grown on the surface of the n-type InP buffer layer including the diffraction grating 13 via an epitaxial growing process in the method for manufacturing the semiconductor laser device of the present embodiment is illustrated in FIG. 5.

As shown in FIG. 5, regions 50 containing deteriorated crystallinity (hereinafter referred to as "crystallinity-deteriorated region") are formed in the portions of the semiconductor multiple-layered film 44 above the diffraction grating boundary 42a and 42b. Such crystallinity-deteriorated regions 50 propagates from origins of bumps toward the surface of the semiconductor multiple-layered film 44 over a width of about 30 μm. Relationship of such crystallinity-deteriorated regions 50 with the drawing width 13a is shown in graphs of FIGS. 6A and 6B.

Figure 6A:
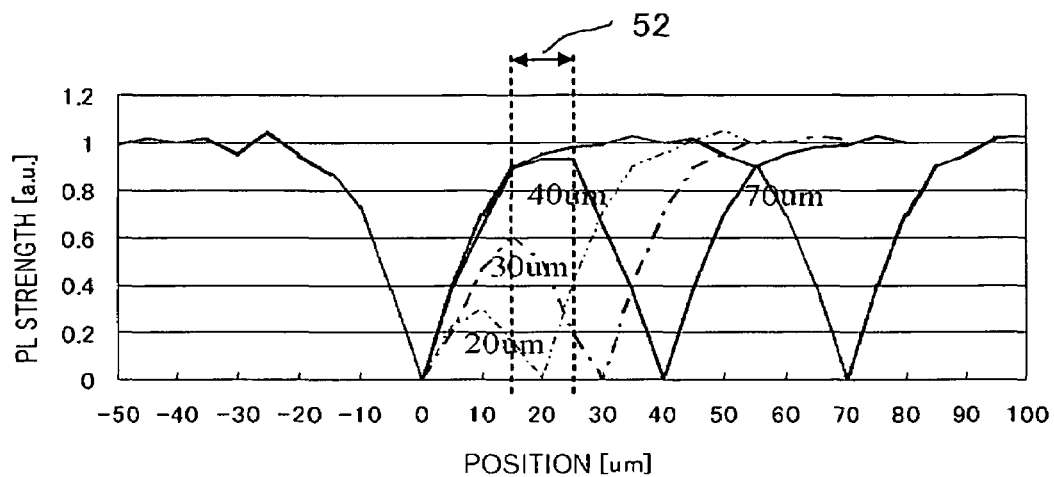
FIGS. 6A and 6B are graphs, showing relationships of PL strength and PL wave length over the drawing width of the diffraction grating, respectively.
Figure 6B:
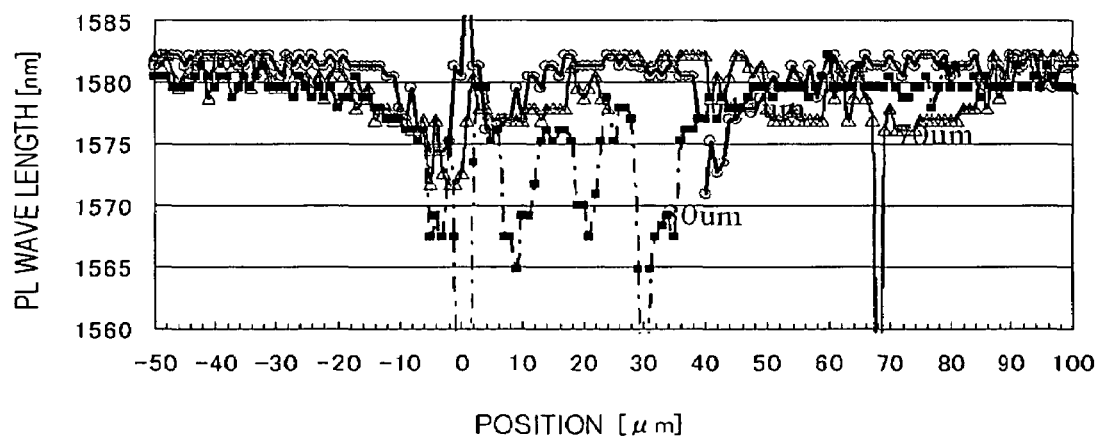

FIGS. 6A and 6B are graphs prepared by plotting photo luminescence (PL) strength and PL wave length, which are obtained by scanning MQW on the diffraction grating by employing a micro PL evaluation apparatus, and the graphs indicate a place dependency of these parameters. Here, among plots of zero in PL strength, a plot of zero in position corresponds to the diffraction grating boundary 42a of FIG. 5, and other plots of zero in PL strength correspond to the diffraction grating boundaries 42b that is remote therefrom by a drawing width. The diffraction gratings 13 were formed to have the widths of 20 μm, 30 μm, 40 μm and 70 μm, and the measurements were carried out.

The results show that, in any case of respective drawing widths 13a, PL strength was lowest and the PL wave length was shortest at the diffraction grating boundary. In regions of the drawing widths 13a of not larger than 30 μm, the PL strength and the PL wave length in the central region of the region for forming are not increased to a level that is equivalent to the region outside the region for forming the diffraction grating that is sufficiently remote from the diffraction grating boundary, and this indicates that a crystal defect created from an origin of the boundary and a region that contains an abnormality in the crystal formulation and the crystal layer thickness are remained.

Since the drawing width 13a of a length equal to or longer than a sum of mesa width+30 μm is employed in first embodiment, a crystalline region 52 having no crystallinity-deteriorated region is included in the central portion. Therefore, the active layer mesa 16 includes no crystallinity-deteriorated region, by forming the active layer mesa 16 in this crystalline region 52. Further, an increased drawing width of 70 μm is selected, the crystalline region 52 is also increased. As such, if the diffraction grating 13 is formed so that the width of the diffraction grating 13 is equal to or longer than the width of the active layer mesa 16+30 μm, a crystal defect created from an origin of the boundary or a crystallinity-deteriorated region that contains an abnormality in the crystal formulation and the crystal layer thickness is not included in the interior of the crystal composing the active layer mesa 16. Therefore, according to the method for manufacturing the semiconductor laser device of the present embodiment, a semiconductor laser device having stabilized properties such as threshold current, slope efficiency, device life time and the like can be obtained.

More specifically, since no region containing deteriorated crystallinity, which spreads from an origin of the diffraction grating boundary, is included in the main function region in the distributed feedback semiconductor laser device (or in the whole device when the recombined layer 18 is removed via an etch process) manufactured in the above-described configuration, improved oscillating characteristics including a wavelength controllability can be achieved with higher reproducibility and uniformity, and a longer life time of the device can also be achieved.

Figure 7:
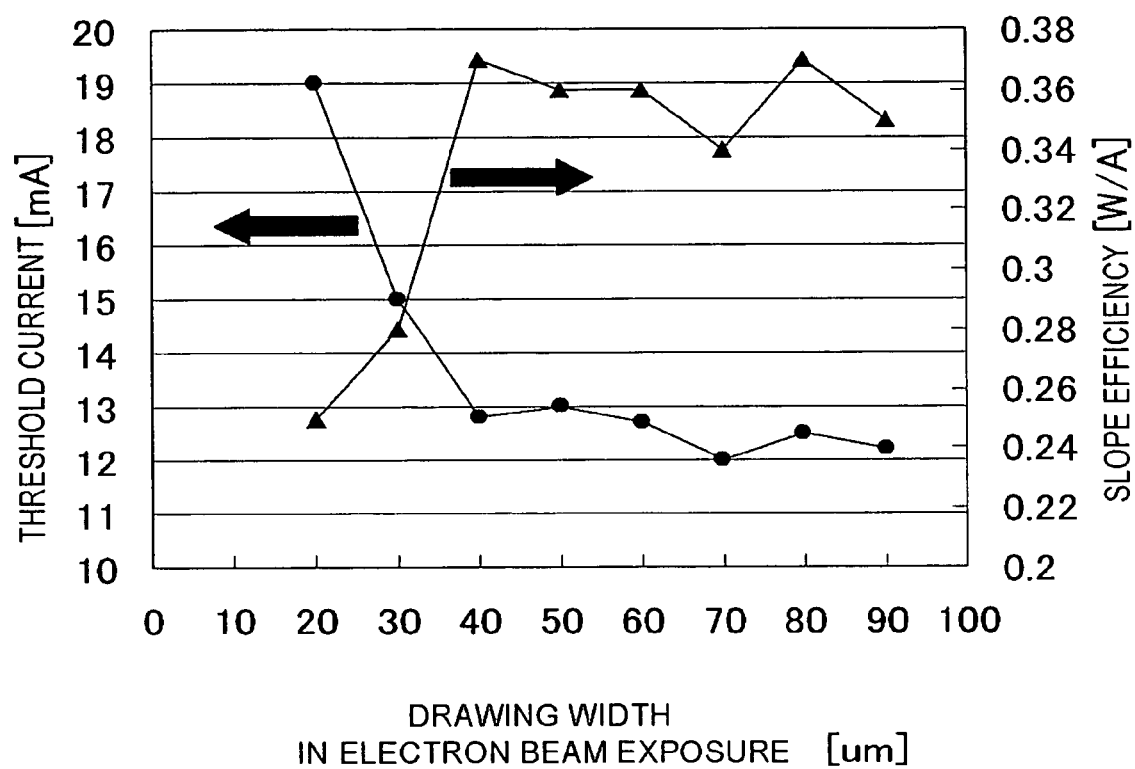
FIG. 7 is a graph, showing relationships of threshold current and slope efficiency over the drawing width of the diffraction grating.

FIG. 7 is graph, showing a relationship of a drawing width via an electron beam exposure process with a threshold current and a slope efficiency, in the case of the distributed feedback semiconductor laser device (including recombined layers 18) manufactured via the manufacturing process of first embodiment. In addition to above, the diffraction gratings 13 were formed to have several drawing widths 13a, which were provided within the range of from 20 μm to 90 μm by 10 μm-interval. The results show that the threshold current is increased and further the slope efficiency is reduced for the drawing width 13a of equal to or lower than 30 μm, at which an influence of the diffraction grating boundary is remained, and thus the device characteristic is considerably deteriorated. On the contrary, the threshold current is reduced and further the slope efficiency is improved for the drawing width 13a of equal to or longer than 40 μm, and thus an influence of the crystallinity-deteriorated region is not appeared.

As such, if the configuration of the device having the drawing width 13a of equal to or longer than 40 μm is employed, a desired active layer mesa 16 can be formed and the crystalline region 52 can be surely assured. Therefore, according to the method for manufacturing the semiconductor laser device of the present embodiment, a semiconductor laser device having stabilized properties such as threshold current, slope efficiency, device life time and the like can be obtained.

In the electron beam exposure process described in Japanese Patent Laid-Open No. 2000-138,413, a method is described, in which a diffraction grating pattern is formed via an electron beam exposure and further a deep UV exposure is conducted for a region where no diffraction grating is to be formed, in order to prevent a deterioration of a crystallinity. Nevertheless, according to such method, the process may be complicated and time required for the exposure process may be increased, leading to a reduced throughput. Further, deteriorations in properties such as an increase of threshold current, a decrease in slope efficiency, a decreases in device life time and the like are still possibly created.

As described above, while it is appeared that the creation of the bump in the diffraction grating boundary results in the deterioration of the crystallinity in the conventional method for manufacturing the semiconductor laser device, the mechanism such phenomenon is not clarified. Therefore, attempts for preventing a creation of a bump in the diffraction grating boundary and reducing the influence thereof are conducted.

In such circumstances, the present inventor have been eagerly investigated and have found that an influence of the crystallinity deterioration can be removed even if a bump is created in the diffraction grating boundary, if the drawing width of diffraction grating is selected to be equal to or larger than a sum of mesa width+30 μm. More specifically, the crystallinity deterioration in the epitaxial layer is caused from an origin of the bump in the diffraction grating boundary, and then the deterioration of the crystallinity will propagate, and thus, the propagation is increased in the transverse direction, as approaching the uppermost epitaxial layer. Further, since the film thickness of the semiconductor multiple-layered film 44 is within a range of from about 0.3 μm to 0.5 μm in view of ensuring the property of the semiconductor laser device, the drawing width of the diffraction grating may be selected to be not smaller than a predetermined value, in order to eliminate an influence of the crystallinity deterioration region.

The present invention is made based on such new scientific knowledge, and in the method for manufacturing the semiconductor laser device, if the diffraction grating is formed so that the drawing width of the diffraction grating is equal to or longer than the width of the active layer mesa 16+30 μm, a region that does not contain a crystallinity-deteriorated region can be formed to have sufficient area. Therefore, if the optical guide layer is formed in such region, a semiconductor laser device having stabilized properties such as threshold current, slope efficiency, device life time and the like can be easily obtained. Further, since an influence of the deterioration in crystallinity created therein can be eliminated by a simple and easy method, an improved throughput can be presented, Second Embodiment A semiconductor laser device of second embodiment has a ridge type laser structure, in which a mesa is formed in a clad, and periphery of the mesa is not plugged with a crystal layer.

Figure 8:
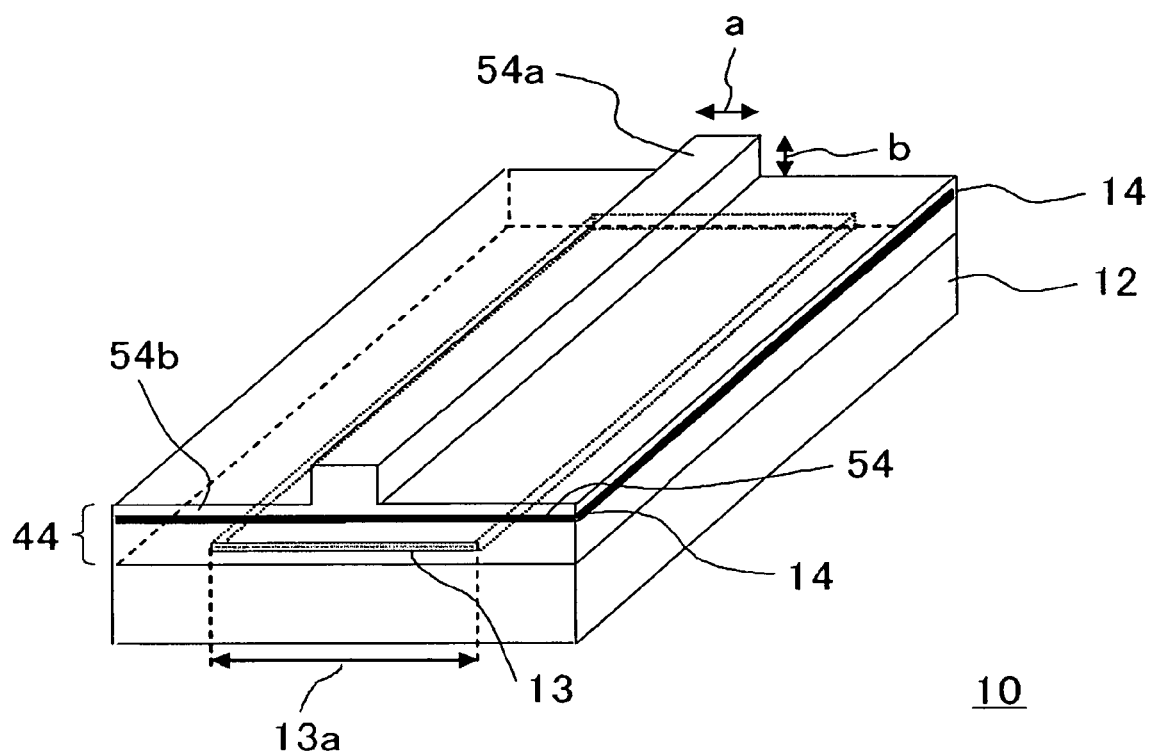
FIG. 8 is a perspective view, schematically illustrating a semiconductor laser device according to second embodiment.

A perspective view of a distributed feedback semiconductor laser device according to second embodiment is illustrated in FIG. 8. As shown in FIG. 8, a semiconductor laser device 10 includes a diffraction grating 13 on a (001) surface of an n-type InP substrate 12, and further includes a semiconductor multiple-layered film on the n-type InP substrate 12, which will serve as an optical guide layer containing an active layer 14. In addition to above, a diffraction grating may be formed on the surface of the n-type InGaAsP guide layer. In the present embodiment, a configuration of having the diffraction grating 13 underneath of the active layer 14 is employed.

The drawing width of the diffraction grating 13 may be equal to or longer than the mesa width (width "a" of ridge 54a)+30 μm. Having the drawing width 13a of the diffraction grating 13 within the above-described range, substantially central crystalline regions except portions respectively remote from the two diffraction grating boundaries 42a and 42b by 15 μm in inner direction are the region where a deterioration of the crystallinity created in the boundaries 42a, 42b does not propagate. Therefore, according to the semiconductor laser device of the present embodiment, properties such as threshold current, slope efficiency, device life time and the like can be stabilized. Further, having the drawing width 13a of equal to or longer than 40 μm, a desired active layer mesa can be formed and the crystalline region including no crystallinity-deteriorated region can be surely assured under the mesa. Therefore, a particularly improved advantageous effect as described above can be presented. In the present embodiment, an exemplary implementation of manufacturing a device having the drawing width of 80 μm will be described.

The semiconductor multiple-layered film 44 has the same configuration as that of the semiconductor laser device of first embodiment, except that the structure of the p-type InP clad layer 54 is different therefrom. The p-type InP clad layer 54 comprises a ridge 54a of a mesa structure, which has a substantially concave-shaped cross section and elongates toward the cavity direction of the semiconductor laser device. The ridge 54a is formed to have a width "a" of about 2 μm and a height "b" of about 2 μm. The ridge 54a is formed right overhead of the substantially central portion having a width of 50 μm of the diffraction grating 13 that contains no crystallinity-deteriorated region.

In addition to above, in the diagrams of the semiconductor laser device 10 of second embodiment illustrated in FIG. 8, electrodes formed on a lower surface of the p-type InP substrate and on the top surface of the ridge 54a or an antireflective coating or an highly reflective coating formed on an end surface in the cavity direction are not shown.

In the distributed feedback semiconductor laser device manufactured in the above-described embodiment, a region having a deteriorated crystallinity propagating from an origin of the diffraction grating boundary is included. However, the region, through which carrier actually flows, is mere a portion of the crystalline region having a width of 50 μm that contains no deterioration of crystallinity propagating therefrom, and thus the crystallinity-deteriorated region only exists in the location that does not contribute to the operation of the laser.

Besides, for example, if a layer thickness and/or a doping concentration of the inner clad layer 54b are changed, laterally-spreading amount of carrier in the inner clad layer 54b is also changed. Nevertheless, similar situation as in the above-described configuration can be achieved by establishing a suitable drawing width of the electron beam exposure that balances therewith. Having such procedure, improved oscillating characteristics including a wavelength controllability can be achieved with higher reproducibility and uniformity, and a longer life time of the device can also be achieved, similarly as in first embodiment.

Next, a process for manufacturing the semiconductor laser device in second embodiment will be described.

First of all, similarly as in first embodiment, the diffraction grating 13 is formed on (001) surface of the n-type InP substrate 12. The drawing width 13a of the diffraction grating 13 may be equal to or longer than the mesa width+30 μm. Having the drawing width 13a of the diffraction grating 13 within the above-described range, substantially central crystalline regions except portions respectively remote from the two diffraction grating boundaries 42a and 42b by 15 μm in inner direction are the region where a deterioration of the crystallinity created in the boundaries 42a, 42b does not propagate. Since the ridge 54a is formed right overhead of the region where a deterioration of a crystallinity does not propagate, according to the semiconductor laser device 10 of the present embodiment, properties such as threshold current, slope efficiency, device life time and the like can be stabilized. Further, having the drawing width 13a of equal to or longer than 40 µm, a desired active layer mesa can be formed and the crystalline region including no crystallinity-deteriorated region can be surely assured under the mesa. Therefore, a particularly improved advantageous effect as described above can be presented. Subsequently, an epitaxial growth of the semiconductor multiple-layered film 44 including the active layer 14 is conducted on the diffraction grating 13—attached p-type InP substrate 12. The semiconductor multiple-layered film 44 includes an n-type InGaAsP guide layer, a first SCH layer composed of undoped InGaAsP, an undoped MQW active layer composed of five layers, a second SCH layer composed of undoped InGaAsP and a p-type InP clad layer, all of which are stacked in this sequence.

Subsequently, an oxide film having a predetermined pattern is manufactured on the p-type InP clad layer 54 via, for example, a thermal CVD process, a photolithography process or an etch process with hydrofluoric acid. Then, a dry etch process is conducted through a mask of such oxide film. Alternatively, a wet etch process may be conducted through a mask of a resist, and in addition, these etch processes may be jointly used. Having such procedure, the ridge 54a is formed to have a width "a" of about 2 µm and a height "b" of about 2 µm. Thereafter, an oxide film having an aperture of 1.8 µm-width is formed on only the portion of the p-type InP clad layer 54 above the ridge 54a via a thermal CVD, a photolithographic and an etch process with hydrofluoric acid.

Subsequently, an electrode composed of TiAu is manufactured on a top surface of the ridge 54a exposed to the bottom of the aperture, and further, the electrode is manufactured on the lower surface of the semiconductor substrate. Thereafter, an electrode-alloying process is conducted at a temperature of 430 degree C. to complete the manufacture of the device. Subsequently, a device is cut out to have a device length of 600 µm and a device width of 250 µm, and then, an antireflective coating (AR) coating exhibiting a reflectivity of equal to or lower than 0.1% is provided on the front end surface (light emitting surface), and a highly reflective (HR) coating exhibiting a reflectivity of 75% is provided on the rear end surface thereof.

By such manufacturing process, the semiconductor laser device of the present embodiment is obtained.

Since an influence of the deterioration in crystallinity created in the epitaxial layer can be eliminated according to semiconductor laser device 10 of the second embodiment, similarly as in first embodiment, an improved throughput can be presented, and properties such as threshold current, slope efficiency, device life time and the like can be stabilized.

In addition, the advantageous effect similar to that obtained in first embodiment can be obtained in the process for manufacturing the semiconductor laser device of the second embodiment, and further, the formation of the recombined layer is not required, so that an influence of a deterioration in crystallinity can be eliminated by a simple and easy method, and an improved throughput can be presented.

Third Embodiment

Figure 9:
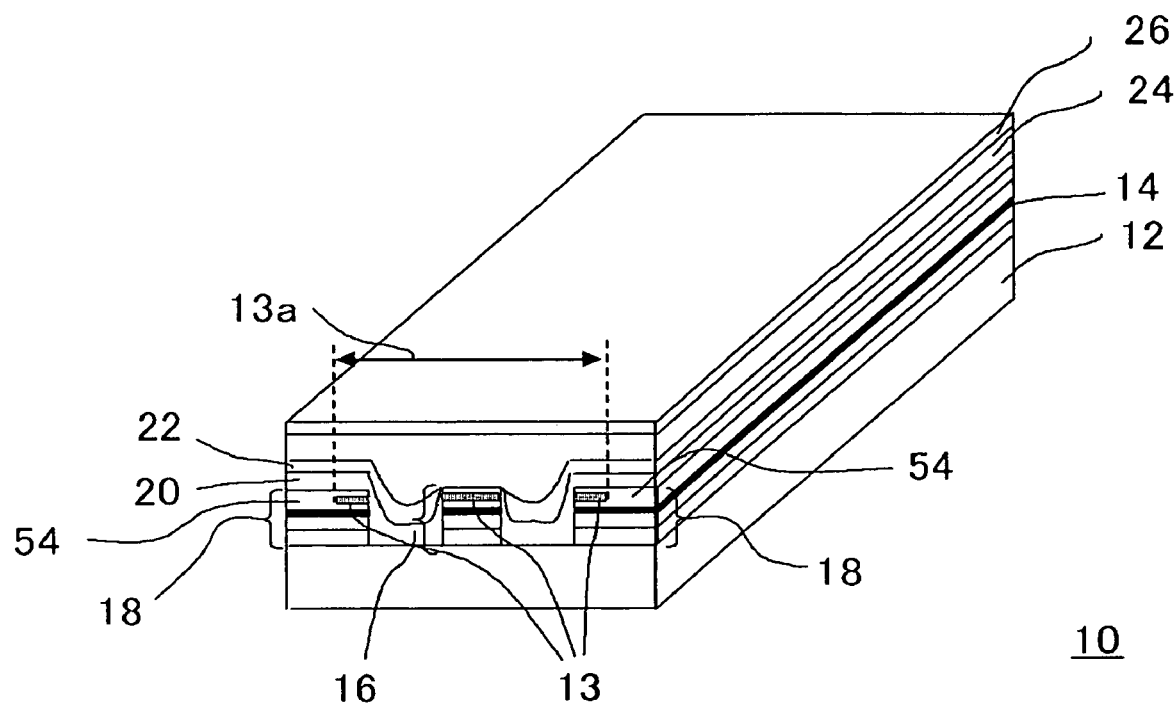
FIG. 9 is a perspective view, schematically illustrating a semiconductor laser device obtained by a manufacturing process according to third embodiment.

In a semiconductor laser device obtained by a manufacturing process of third embodiment, a diffraction grating 13 is formed above an active layer 14, as shown in FIG. 9.

As shown in FIG. 9, the semiconductor laser device includes, on an n-type InP substrate 12, a first SCH layer, a MQW active layer 14, a second SCH layer, a p-type InGaAsP guide layer, an active layer mesa 16 composed of a p-type InP clad layer and a pair of recombined layers 18. Further, the diffraction grating 13 is formed in such p-type InP clad layer 54.

The diffraction grating 13 is formed as follows. First of all, a thin film of a p-type InP clad film is formed on a surface of a p-type InGaAsP guide layer. Subsequently, substantially belt-shaped diffraction grating 13 having a depth of 30 nm and a width of 40 µm is formed on the surface of the clad film of such thin film along a cavity direction of the semiconductor laser device via the above-described electron beam exposure process and etch process. Thereafter, a p-type InP clad film is deposited on the surface of the p-type InP clad film having the diffraction grating 13 formed thereon to embed the diffraction grating 13 within the p-type InP clad layer.

Thereafter, in the case of the embedded-type semiconductor laser device, the device is manufactured similarly as in first embodiment, and on the other hand, in the case of the ridge mesa-type semiconductor laser device, the device is manufactured similarly as in second embodiment.

Concerning the distributed feedback semiconductor laser device of third embodiment, when the embedded-type semiconductor laser device is employed, the crystallinity deterioration region is removed in the formation process for the active layer mesa, and on the other hand, when the ridge mesa-type semiconductor laser device is employed, the crystallinity deterioration region is removed in the formation process for the ridge mesa.

The advantageous effect similar to that obtained in first embodiment can be obtained in the process for manufacturing the semiconductor laser device of the third embodiment, and further, the diffraction grating 13 can be formed in the location above the active layer 14, thereby providing a possibility for freely designing the device.

Fourth Embodiment

Figure 10A:
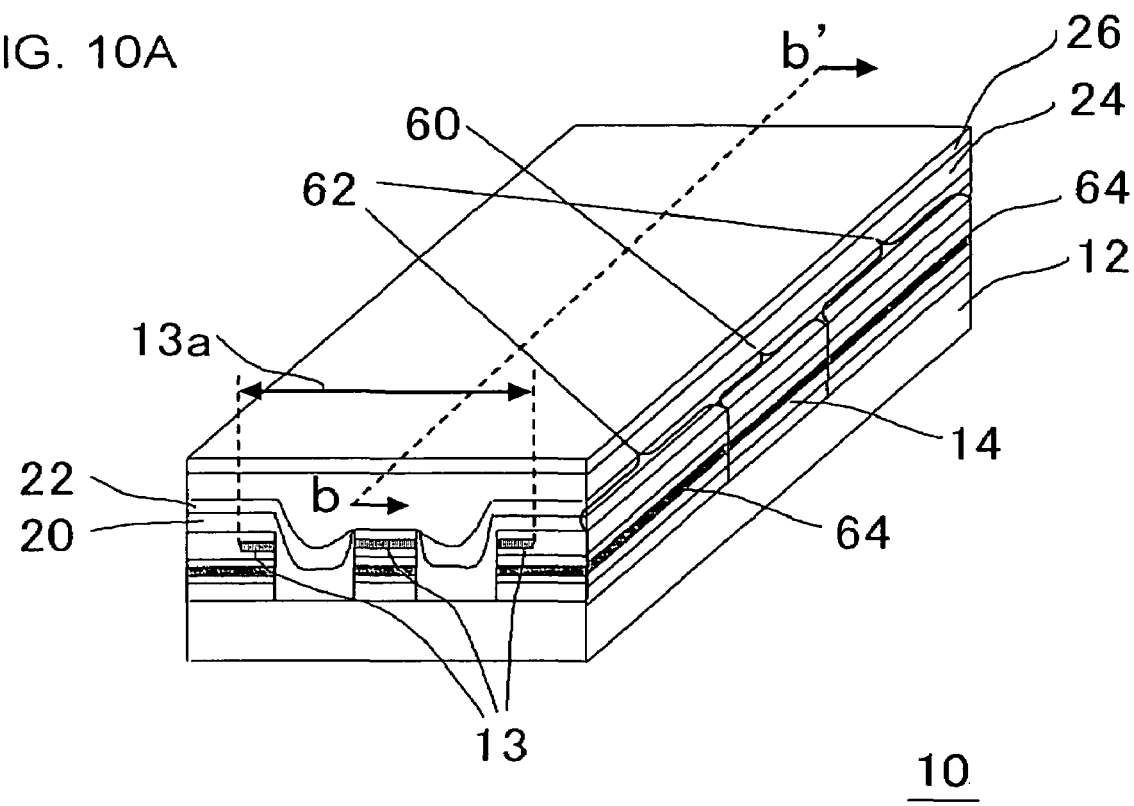
FIG. 10A is a perspective view, schematically illustrating a semiconductor laser device obtained by a manufacturing process according to fourth embodiment.
Figure 10B:
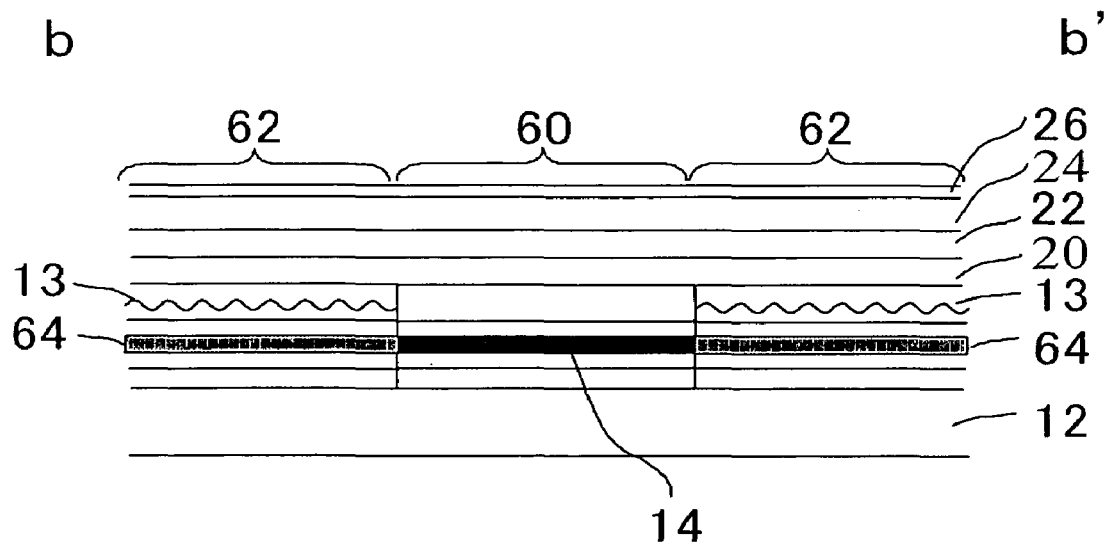
FIG. 10B is a cross-sectional view of such semiconductor laser device along line b-b'.
Figure 11:
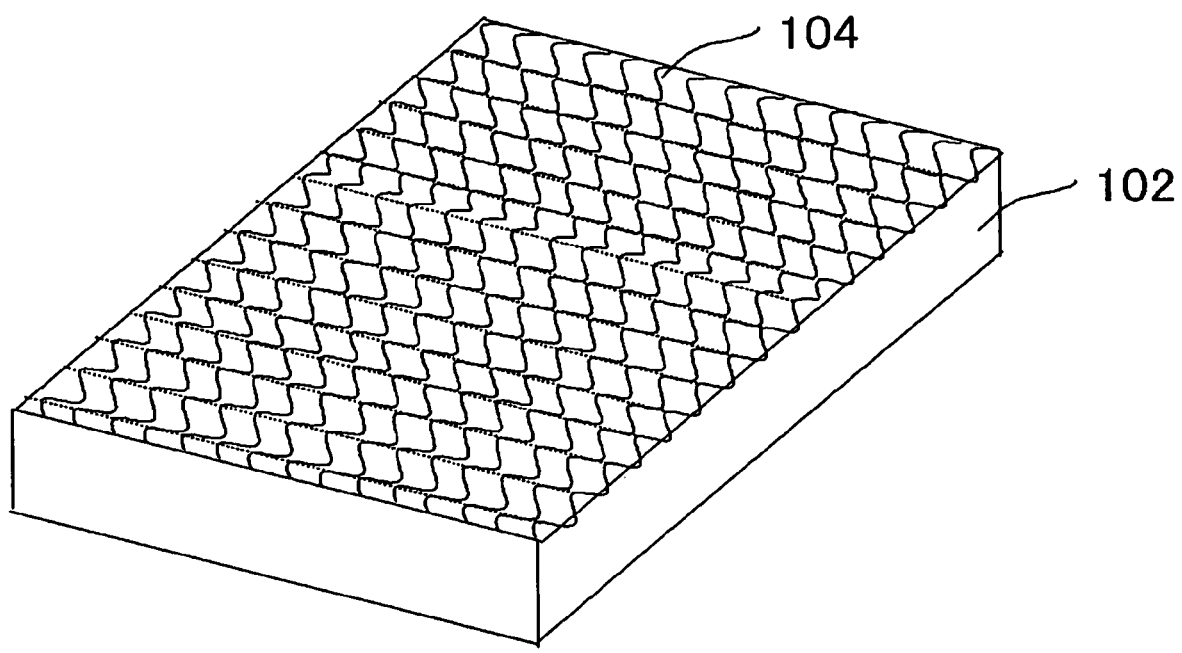
FIG. 11 is a perspective view, illustrating a diffraction grating obtained by a conventional interferometric exposure process.

A semiconductor laser device obtained by a manufacturing process according to fourth embodiment includes a distributed Bragg reflector (DBR) laser structure, in which distributed Bragg reflectors 62 are accumulated in each side of the active region 60, as shown in FIG. 10A. In addition to above, FIG. 10B is a cross-sectional view of the semiconductor laser device shown in FIG. 10A along line b-b'. In addition, the distributed Bragg reflection device 62 is a passive optical guide having a diffraction grating 13.

A method for manufacturing a semiconductor laser device of the fourth embodiment will be described as follows.

First, a first SCH layer, a MQW active layer 14, a second SCH layer, a p-type InGaAsP guide layer and a p-type InP clad layer are formed in sequence on the entire surface of the n-type InP substrate 12 in the side where no diffraction grating is formed, via an epitaxial growing process.

Thereafter, crystalline regions located in each side of the active region 60 where a distributed Bragg reflector 62 is to be formed a dry etch process or a wet etch process through a mask of an oxide film such as $SiO_2$ or the like or a resist. Subsequently, a passive optical guide serving as a distributed Bragg reflector 62 via a bat joint technology is formed by an epitaxial growing process. Here, the passive optical guide is composed of a core layer 64 having an energy band gap that is larger than that of the active layer 14, an SCH layer formed above and under the core layer and an InGaAs guide layer and an InP clad layer. A method for forming the diffraction grating 13 on the passive optical guide is conducted similarly as in third embodiment. In addition to above, when the diffraction grating 13 is formed on the surface of the n-type InP substrate 12, the formation process can be conducted similarly as in second embodiment, and on the other hand, when the diffraction grating 13 is formed under the active layer, the formation process can be conducted similarly as in first embodiment.

In addition, when an embedded-type semiconductor laser device is employed, the device is manufactured similarly as in first embodiment, and on the other hand, when the ridge mesa-type semiconductor laser device is employed, the device is manufactured similarly as in second embodiment.

Concerning the distributed reflecting semiconductor laser device manufactured along the above-described configuration, when an embedded-type laser device is employed, the crystallinity deterioration region is removed in the process for forming the active layer mesa, and on the other hand, when the ridge mesa-type laser device is employed, an influence of the crystallinity deterioration region is eliminated in the process for forming the ridge mesa.

The advantageous effect similar to that obtained in first embodiment can be obtained in the process for manufacturing the semiconductor laser device of the fourth embodiment, and further, the DBR laser structure can be utilized for the semiconductor laser device obtained by such method.

While the preferred embodiments of the present invention have been described above in reference to the annexed figures, it should be understood that the disclosures above are presented for the purpose of illustrating the present invention, and various configurations other than the above described configurations can also be adopted.

For example, the configuration described in the present embodiment may also be applied in optical integrated devices such as electro-absorption modulator integrated semiconductor laser devices, which includes a semiconductor laser device and a modulator integrated therein.

In addition, while MQW is composed of InGaAsP/InP-containing material in the above-described example, AlGaAs/GaAs-containing material, AlGaInP/GaInP-containing material, GaN-containing material, ZnSe-containing material and other compound semiconductor materials may be employed.

What is claimed is:

1. A method for manufacturing a semiconductor laser device, comprising:
    forming a diffraction grating on a surface of a semiconductor substrate or on a film on the surface of said semiconductor substrate so that a width of said diffraction grating in a direction that is orthogonal to a cavity direction of said semiconductor laser device is a width equal to or longer than a sum of a mesa width and 30 µm;
    forming a multiple-layered film on a surface of said diffraction grating; and
    forming the mesa parallel to the cavity direction by partially removing said multiple-layered film and partially removing said diffraction grating so that at least a substantially-central portion of said diffraction grating is remained, after said forming said multiple-layered film,
    wherein said forming the multiple-layered film includes forming an active layer on the whole surface of said diffraction grating.

2. The method for manufacturing the semiconductor laser device according to claim 1, wherein the width of said diffraction grating is equal to or longer than the sum of the mesa width and 40 µm.

3. The method for manufacturing the semiconductor laser device according to claim 1, wherein said forming said diffraction grating includes forming said diffraction grating on the surface of said film having the active layer formed on said semiconductor substrate via an electron beam exposure process.

* * * * *